United States Patent
Makino et al.

(10) Patent No.: US 10,276,386 B2
(45) Date of Patent: Apr. 30, 2019

(54) SIGNAL RELAY BOARD FOR POWER SEMICONDUCTOR MODULES

(71) Applicant: FUJI ELECTRIC CO., LTD., Kawasaki (JP)

(72) Inventors: Ryohei Makino, Hachioji (JP); Motoyoshi Kubouchi, Matsumoto (JP); Kiyoshi Takahashi, Sagamihara (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 92 days.

(21) Appl. No.: 15/638,009

(22) Filed: Jun. 29, 2017

(65) Prior Publication Data

US 2018/0053654 A1 Feb. 22, 2018

(30) Foreign Application Priority Data

Aug. 17, 2016 (JP) .................. 2016-160062

(51) Int. Cl.
| | |
|---|---|
| *H01L 21/24* | (2006.01) |
| *H01L 21/22* | (2006.01) |
| *H01L 21/288* | (2006.01) |
| *H02M 7/48* | (2007.01) |
| *H05K 1/00* | (2006.01) |
| *H01L 25/18* | (2006.01) |
| *H01L 25/11* | (2006.01) |
| *H02M 7/00* | (2006.01) |

(52) U.S. Cl.
CPC .............. *H01L 21/24* (2013.01); *H01L 21/22* (2013.01); *H01L 21/288* (2013.01); *H02M 7/48* (2013.01); *H05K 1/00* (2013.01); *H01L 25/115* (2013.01); *H01L 25/18* (2013.01); *H02M 7/003* (2013.01)

(58) Field of Classification Search
CPC ....... H01L 21/24; H01L 21/288; H01L 21/22; H01L 25/115; H01L 25/18; H05K 1/00; H02M 7/48; H02M 7/003
See application file for complete search history.

(56) References Cited

U.S. PATENT DOCUMENTS 5,296,735 A * 3/1994 Fukunaga ............. H01L 23/142
257/659
5,504,378 A * 4/1996 Lindberg .............. H02M 7/003
257/678

(Continued)

FOREIGN PATENT DOCUMENTS

| JP | 2015-198545 | 11/2015 |
| WO | WO 2013/145619 A1 | 10/2013 |

*Primary Examiner* — Selim U Ahmed (57) ABSTRACT

Signal relay board for power semiconductor modules enabling electrical connection between power semiconductor modules and a drive unit driving same. A first wire layer, a second wire layer, a third wire layer, and a fourth wire layer of a multiphase wire portion are assigned with a first control wire layer serving as a path to provide a control signal to a first semiconductor device of the modules, a first ground wire layer serving as a path to provide a ground potential to a low potential side terminal of the first semiconductor device of the semiconductor modules, a second control wire layer serving as a path to provide a control signal to a second semiconductor device of the modules, and a second ground wire layer serving as a path to provide a ground potential to the second semiconductor device of the modules.

19 Claims, 6 Drawing Sheets

(56) References Cited

U.S. PATENT DOCUMENTS

| | | |
|---|---|---|
| 9,312,192 B2 | 4/2016 | Horio et al. |
| 9,379,083 B2 | 6/2016 | Iizuka et al. |
| 9,385,061 B2 | 7/2016 | Nakamura et al. |
| 2012/0087095 A1* | 4/2012 | Tokuyama ............ B60K 6/365 361/721 |
| 2014/0346659 A1 | 11/2014 | Nakamura et al. |
| 2014/0361424 A1 | 12/2014 | Horio et al. |
| 2014/0367736 A1 | 12/2014 | Iizuka et al. |

* cited by examiner

SIGNAL RELAY BOARD FOR POWER SEMICONDUCTOR MODULES

CROSS-REFERENCE TO RELATED APPLICATIONS

This application claims benefit of foreign priority under 35 USC 119 based on Japanese Patent Application No. 2016-160062 filed on Aug. 17, 2016, the entire contents of which are incorporated by reference herein.

TECHNICAL FIELD

The present invention relates to a signal relay board connected to semiconductor modules for power conversion (hereinafter referred to as power semiconductor modules, or simply as modules) and used for transmitting a control signal to the modules.

BACKGROUND ART

In a power conversion circuit constituting a power conversion device, such as an inverter device, an uninterruptible power supply device, a power conditioner, various types of power conversion devices for railway vehicles, a machine tool, and an industrial robot, a power semiconductor module to which a power semiconductor element is mounted is used.

As the power semiconductor element which performs switching, a metal oxide semiconductor field effect transistor (MOS-FET) and an insulated gate bipolar transistor (IGBT) made of Si are widely used. In recent years, the power semiconductor element made of a wide bandgap semiconductor, such as SiC and GaN, has been actively researched, developed, and examined for practical use, and also a part of switching elements, such as a Sic-MOSFET, a silicon carbide junction field effect transistor (SiC-JFET), and a gallium nitride high electron mobility transistor (GaN-HEMT), has been already put into practical use.

Above all, in the field of power semiconductor modules, a 2-in-1 module in which in the interior of one module, sets (arms) including a group of switching elements are housed in two series is well known. In the 2-in-1 module, a half-bridge circuit known in the field of power conversion circuits can be composed of one module, and for example, one phase of a three-phase inverter circuit can be made of one module. In the 2-in-1 module, a positive electrode side arm is referred to as upper arm, and a negative electrode side arm as lower arm.

Incidentally, in the field of power electronics in which the power conversion circuit is configured using a power semiconductor module to manufacture the power conversion device, to increase the capacity of power handled in the circuit according to the capacity of the device, employing a plurality of power semiconductor modules connected in parallel is performed (for example, see PTL 1).

CITATION LIST

Patent Literature

PTL 1: WO 2013/145619 A1

SUMMARY OF INVENTION

Technical Problem

To drive the power semiconductor switching element, drawing out a control wire and a ground wire which forms a pair with the control wire and provides a ground potential from a drive unit and connecting the same respectively to a control terminal and a ground terminal of the power semiconductor switching element are required.

Hitherto, forming each of the control wire and the ground wire of a cable, and adapting both to be a parallel cable or a twisted cable to connect the drive unit and the power semiconductor modules have been widely performed.

On the other hand, in recent years, in accordance with an increase in frequency of an operating frequency and an enhancement in switching speed of the power semiconductor switching element, to prevent an influence of noises, suppress overshoot and undershoot due to a voltage surge, prevent ringing, and the like, a reduction in inductance of the pair of the control wire and the ground wire has been required.

Above all, the necessity thereof is high when a wide bandgap switching element, such as SiC and GaN, which is often used for high frequency and high switching is employed. Thus, configuring the control wire and the ground wire as wiring on a board, such as a printed wiring board, has been examined.

Incidentally, in a case of the 2-in-1 module, it is required with respect to each arm that the control wire and the ground wire are connected. Then, in a case in which the plurality of 2-in-1 modules are connected in parallel to be used, it is required with respect to each arm that the control wire and the ground wire from the drive unit are each branched and are respectively connected to the control terminal and the ground terminal of the corresponding arm of each of the modules connected in parallel.

Herein, for example, in a case in which the two 2-in-1 modules of the same type are arranged to be used, if the pair of the control terminal and the ground terminal of each arm is arranged in the order of an upper arm and a lower arm of a first power semiconductor module PM1 and an upper arm and a lower arm of a second power semiconductor module PM2 and wiring is made such that a signal is transmitted thereto from a single drive unit, there inevitably occurs a part at which at least one pair of the control wire and the ground wire intersects with another pair of the control wire and the ground wire.

In conventional cable wiring, cable wiring pairs may be intersected with each other, which, however, cannot be easily adapted in a case in which wiring is desirably made according to a method of configuration on a board as described above, and such a method is not obvious.

Thus, the present invention has been made in view of the problem of the above conventional example and has an object to provide a signal relay board for power semiconductor modules which easily enables electrical connection between a plurality of power semiconductor modules and a drive unit which drives the same in a case in which the plurality of power semiconductor modules are connected in parallel.

Solution to Problem

To achieve the above object, the signal relay board for power semiconductor modules of the present invention is a signal relay board for power semiconductor modules that provides connection between a plurality of power semiconductor modules which houses a first semiconductor device and a second semiconductor device connected in series and a drive unit which drives the first semiconductor device and the second semiconductor device, the signal relay board for power semiconductor modules including a multiphase wire portion in which a first wire layer, a second wire layer, a third wire layer, and a fourth wire layer are stacked in this order, in which the first wire layer, the second wire layer, the third wire layer, and the fourth wire layer are respectively assigned with a first control wire layer which serves as a path to provide a control signal to the first semiconductor device of the plurality of power semiconductor modules, a first ground wire layer which serves as a path to provide a ground potential to a low potential side terminal of the first semiconductor device of the plurality of power semiconductor modules, a second control wire layer which serves as a path to provide a control signal to the second semiconductor device of the plurality of power semiconductor modules, and a second ground wire layer which serves as a path to provide a ground potential to the second semiconductor device of the plurality of power semiconductor modules.

Advantageous Effects of Invention

According to an aspect of the present invention, it is possible to provide the signal relay board for power semiconductor modules which easily enables connection in a case in which a plurality of 2-in-1 type power semiconductor modules are employed to be connected in parallel to increase the capacity of power handled in a circuit according to the capacity of a power conversion device to be manufactured.

DESCRIPTION OF EMBODIMENTS

Embodiments of the present invention will now be described with reference to the drawings. In the following description of the drawings, same or similar parts are assigned same or similar reference numerals. However, it is noted that the drawings are schematic and that the relationship between thickness and planar dimensions, the proportion of thicknesses of layers, and the like are different from those applied in practice. Thus, specific thicknesses and dimensions should be determined with reference to the following description. In addition, some portions may have different dimensional relations and proportions between the drawings.

Moreover, the embodiments as described below are to illustrate a device or a method for embodying the technical idea of the present invention, and the technical idea of the present invention is not to define a material, a shape, a configuration, and an arrangement of a constituting element, and the like as those described below. Embodiments of the present invention can be modified in various ways without departing from the technical scope as recited and defined by the claims.

First, an embodiment of a signal relay board for power semiconductor modules illustrating an aspect of the present invention will be described.

(Power Semiconductor Modules to be Connected)

To begin with, a plurality of, for example, two power semiconductor modules PM1, PM2 to which the present invention can be applied will be described. Each of the power semiconductor modules PM1, PM2 is composed of a 2-in-1 module. The 2-in-1 module is a module in which in the interior of one module, an upper arm UA and a lower arm LA which include a group of semiconductor devices are housed in series.

Figure 3:
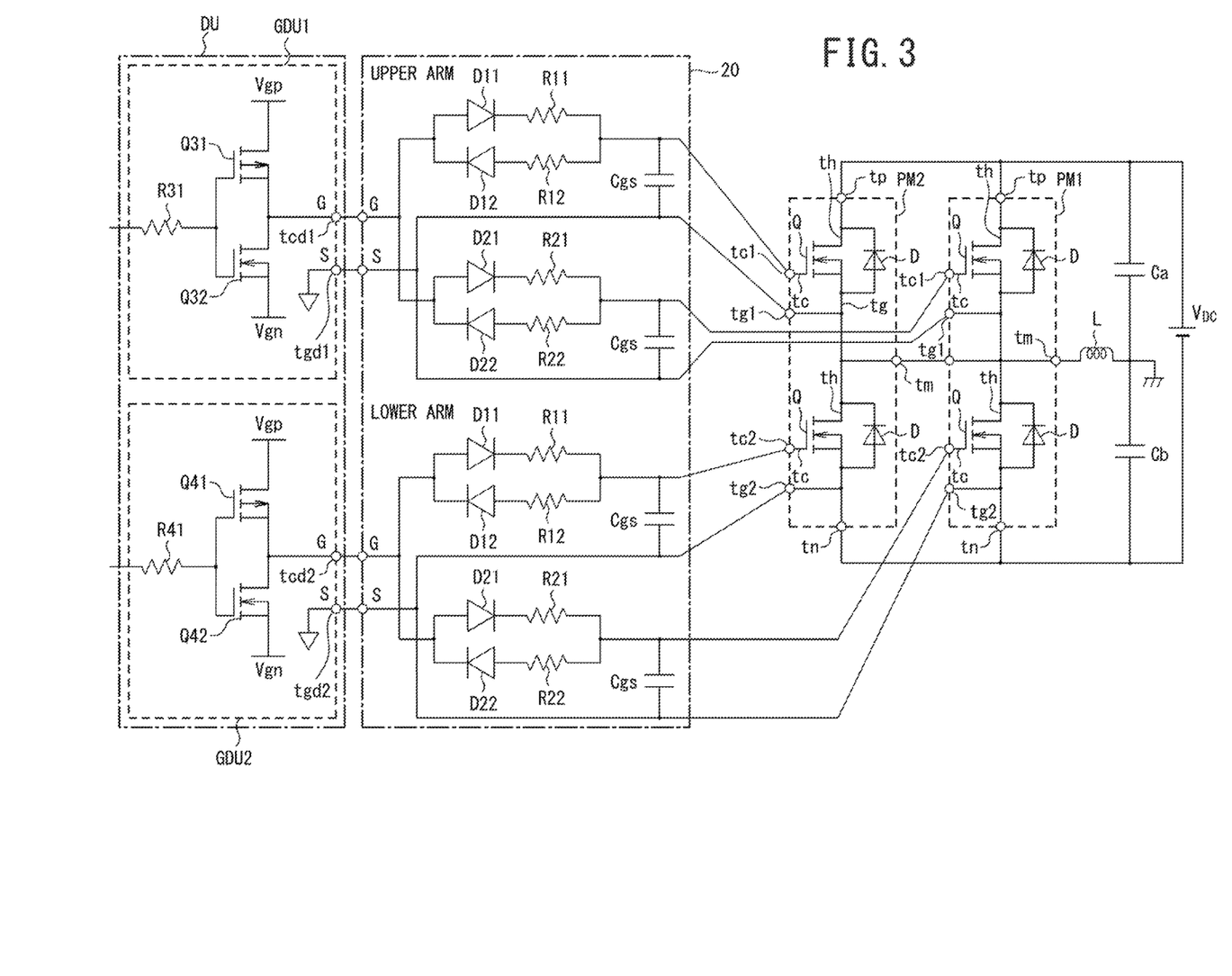
FIG. 3 is a circuit diagram of the power conversion device.

Usually, the so-called 2-in-1 module refers to a half-bridge module as illustrated in FIG. 3 in which both of the upper arm UA and the lower arm LA include a semiconductor switching element Q as a semiconductor device and a type of devices and a number of chips included in the upper arm UA and the lower arm LA are the same. However, in the present embodiment, it is possible to employ the module in which at least one of the upper arm UA and the lower arm LA includes the semiconductor switching element Q and the type of devices and the number of chips included in the upper arm UA and the lower arm LA are different.

For example, it is possible to employ a chopper module in which one of the arms includes the semiconductor switching element Q as a semiconductor device and the other arm is composed only of a diode as a semiconductor device. Moreover, a number of the power semiconductor modules to be connected is plural which is two or more. The drawings of the embodiment illustrate a case in which the number of the power semiconductor modules to be connected is two, but if the number thereof is three or more, adaptation can be enabled by a suitable design based on the techniques disclosed by the present invention.

Herein, the semiconductor switching element Q may be a semiconductor switching element, such as a MOS-FET and an IGBT of Si which are widely used. Moreover, it is also possible to employ a semiconductor switching element, such as a Sic-MOSFET, a SiC-JFET, and a GaN-HEMT, which is a power semiconductor element made of a wide bandgap semiconductor, such as SiC and GaN, that has been actively researched, developed, and examined for practical use, and also a part thereof has been already put into practical use.

As illustrated in FIG. 3, such semiconductor switching element Q is provided with a high potential side terminal th, a control terminal tc, and a ground terminal tg. The high potential side terminal th is a drain terminal in the MOSFET and a collector terminal in the IGBT and a bipolar transistor. The control terminal tc is a gate terminal in a field effect transistor (FET), such as the MOSFET and the IGBT, and a base terminal in the bipolar transistor. The ground terminal tg is a source terminal in the MOSFET and an emitter terminal in the IGBT and the bipolar transistor.

In the MOSFET and the IGBT, a high voltage is applied in advance between the drain or collector terminal and the ground terminal, and by a voltage applied between the control terminal and the ground terminal, on/off of a main circuit current flowing from the drain or collector terminal toward the ground terminal is controlled.

The power semiconductor modules PM are provided with, in each of the arms UA, LA, the high potential side terminal th, the control terminal tc, and the ground terminal tg, and often include, as a main terminal for access to a main circuit voltage and current, a P terminal tp connected to the high potential side terminal th of the upper arm UA, an M terminal tm connected to the ground terminal tg of the upper arm UA and the high potential side terminal th of the lower arm LA, and an N terminal to connected to the ground terminal tg of the lower arm LA, and are often provided with, as a terminal for control, control terminals tc1, tc2 for each of the upper arm UA and the lower arm LA and ground terminals tg1, tg2 in such a manner as to respectively form a pair therewith.

Note that in a case of the half-bridge module as described above, in general, a free wheeling diode D is connected in anti-parallel to each semiconductor switching element Q. It is possible either or both that in the interior of a chip of the semiconductor device constituting each of the arms UA, LA, a body diode parasitic in anti-parallel on the semiconductor switching element is contained and that a diode is mounted in anti-parallel to a chip of the semiconductor switching element. In a case in which the diode is mounted in anti-parallel to the chip of the semiconductor switching element, such diode may be a diode of Si and also may be a diode, such as a Schottky barrier diode (SBD) made of a wide bandgap semiconductor, such as SiC and GaN.

Moreover, in a case of the chopper module as described above, the diode of the arm composed only of the diode may be a diode made of Si similarly to the diode in the case in which the diode is mounted in anti-parallel to the chip of the semiconductor switching element as described above and also may be a diode, such as a Schottky barrier diode (SBD) made of a wide bandgap semiconductor, such as SiC and GaN.

Incidentally, diodes are originally not provided with a control terminal. In the chopper module, there are cases in which the arm composed only of the diode is also provided with or is not provided with a control terminal as a terminal for control and a ground terminal in such a manner as to form a pair therewith in view of appearance of the module. A signal relay board 20 according to the present embodiment is not prevented from being applied even in a case in which such an arm is present in the module to be connected.

Figure 1:
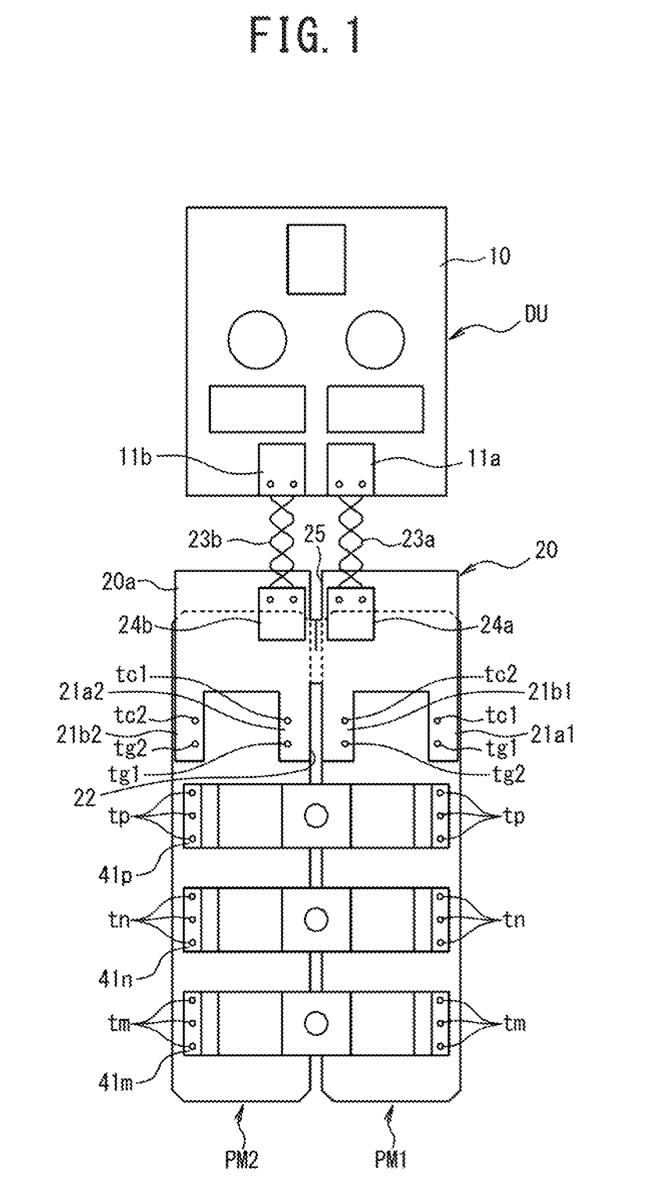
FIG. 1 is an entire configuration diagram illustrative of an example of a power conversion device to which a signal relay board for power semiconductor modules of the present invention is applied.

As illustrated in FIG. 1, in the power semiconductor modules PM1, PM2, the P terminal tp, the N terminal tn, and the M terminal tm having a pin shape are longitudinally arranged in this order on an upper surface. Moreover, in the power semiconductor modules PM, at a right side edge side, the control terminal tc1 (gate terminal G) and the ground terminal tg1 (source terminal S) of the upper arm UA are arranged, and at a left side edge side, the control terminal tc2 (gate terminal G) and the ground terminal tg2 (source terminal S) of the lower arm LA are arranged in such a manner as to face each other at a side opposite to the N terminal tn with respect to the P terminal tp on the upper surface in a width direction orthogonal to a longitudinal direction. The control terminals tc1, tc2 and the ground terminals tg1, tg2 are formed into a pin shape to project upward from the upper surface of the power semiconductor modules PM.

(Drive Unit)

The plurality of power semiconductor modules PM are controlled and driven by a drive unit DU. The drive unit DU of the present invention includes a gate drive circuit which provides a control signal to the power semiconductor modules PM1, PM2. The presence/absence of a control circuit in a narrow sense which performs control at a higher order further upstream of the same is not in question. Moreover, configuration may be made as a board integral with a control circuit in a narrow sense and also may be separately made.

The drive unit DU according to the present embodiment is configured to output a control signal to at least the upper arm UA and the lower arm LA to be driven and from which a control wire therefor and a ground wire which provides a ground potential are drawn out. In the present embodiment, it is supposed to collectively provide a control signal to each of the upper arm UA and the lower arm LA of the power semiconductor modules to be driven.

In the present embodiment, as illustrated in FIG. 1, the drive unit DU is formed on one circuit board 10. As illustrated in FIG. 3, such drive unit DU includes a gate drive circuit for upper arm GDU1 which, for example, supplies a gate control signal to the control terminal tc1 of the upper arm UA of the power semiconductor module PM and a gate drive circuit for lower arm GDU2 which supplies a gate control signal to the control terminal tc2 of the lower arm LA of the power semiconductor module PM.

The gate drive circuit GDU1 includes a series circuit of a P channel MOSFET Q31 and an N channel MOSFET Q32 connected in series between a positive electrode side control power supply Vgp and a negative electrode side control power supply Vgn. Then, a gate of the P channel MOSFET Q31 and the N channel MOSFET Q32 is connected through a resistance R31 to a high-order control unit (unillustrated).

Moreover, the gate drive circuit GDU1 is connected to a control signal output terminal tcd1 at which a drain of the P channel MOSFET Q31 and a drain of the N channel MOSFET Q32 are connected to each other and which outputs a control signal. Further, the gate drive circuit GDU1 includes a ground terminal tgd1 connected to a ground potential. Then, as illustrated in FIG. 1, the control signal output terminal tcd1 and the ground terminal tgd1 are connected to a cable connector 11a provided at one end side of the circuit board 10.

The gate drive circuit GDU2 includes a series circuit of a P channel MOSFET Q41 and an N channel MOSFET Q42 connected in series between the positive electrode side control power supply Vgp and the negative electrode side control power supply Vgn. Then, a gate of the P channel MOSFET Q41 and the N channel MOSFET Q42 is connected through a resistance R41 to a high-order control unit (unillustrated).

Moreover, the gate drive circuit GDU2 is connected to a control signal output terminal tcd2 (gate terminal G) at which a drain of the P channel MOSFET Q41 and a drain of the N channel MOSFET Q42 are connected to each other and which outputs a control signal. Further, the gate drive circuit GDU2 includes a ground terminal tgd2 (source terminal S) connected to a ground potential. Then, as illustrated in FIG. 1, the control signal output terminal tcd2 and the ground terminal tgd2 are connected to a cable connector 11b provided at one end side of the circuit board 10.

(Signal Relay Board for Power Semiconductor Modules)

Figure 2:
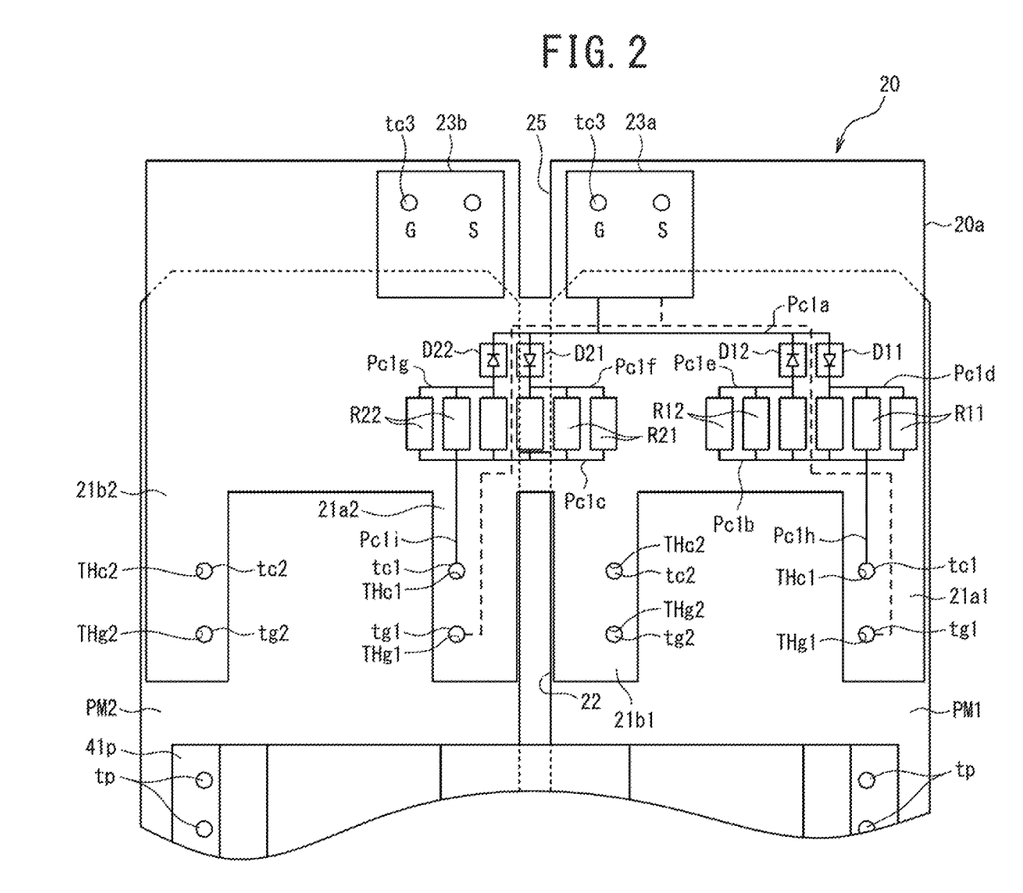
FIG. 2 is an enlarged plan view of the signal relay board for power semiconductor modules of FIG. 1.
Figure 4:
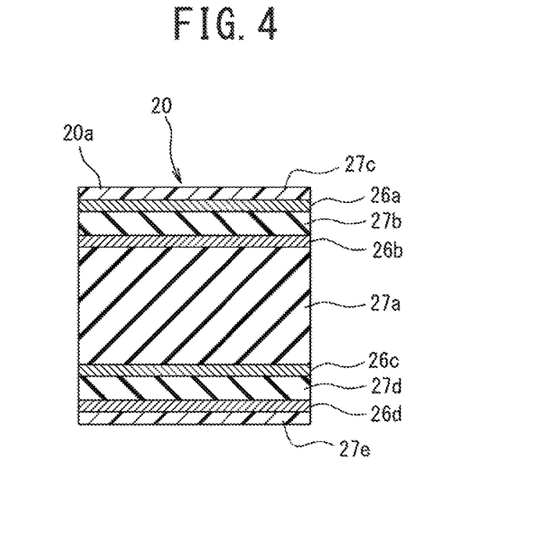
FIG. 4 is a cross-sectional view of the signal relay board for power semiconductor modules.

Moreover, to connect the two power semiconductor modules PM1, PM2 and the drive unit DU, the signal relay board for power semiconductor modules (hereinafter simply referred to as signal relay board) 20 is provided. As illustrated in FIGS. 1, 2, and 4, the signal relay board 20 includes a multiphase board portion 20a composed of a four-layer printed wiring board having a flat plate shape. The multiphase board portion 20a has such a width that the power semiconductor modules PM1, PM2 can be arranged in parallel to maintain a predetermined insulation distance and connected.

In the multiphase board portion 20a, for example, at a front end side which is one end, plate portion for connections 21a1, 21b1 connected to the power semiconductor module PM1 are formed to project, and plate portion for connections 21a2, 21b2 connected to the power semiconductor module PM2 are formed to project. Then, between the plate portions for connection 21b1 and 21a2 at a center portion, a slit for insulation 22 is formed from the front end side toward a backward side.

Moreover, in the multiphase board portion 20a, at a back end side which is the other end, cable connectors 24a, 24b respectively connected to the cable connectors 11a, 11b of the drive unit DU through twisted cables 23a, 23b are arranged. Between the cable connectors 24a and 24b, a slit for insulation 25 which secures an insulation distance is formed.

As illustrated in FIG. 4, the multiphase board portion 20a is composed of the four-layer printed wiring board in which a first wire layer 26a, a second wire layer 26b, a third wire layer 26c, and a fourth wire layer 26d are vertically arranged in this order starting from top.

Herein, in the multiphase board portion 20a, a flat-plate-shaped core member 27a having a thickness of, for example, substantially 1 mm at a center portion is a center base member, and at a front surface and a rear surface of the core member 27a, the second wire layer 26b and the third wire layer 26c are respectively formed. Above the second wire layer 26b, the first wire layer 26a is formed to have an insulation layer 27b composed of a prepreg having a thickness of, for example, several 100s μm therebetween, and at a front surface of the first wire layer 26a, a resist layer 27c which provides protection from electrical insulation and external environment is formed.

Below the third wire layer 26c, the fourth wire layer 26d is formed to have an insulation layer 27d composed of a prepreg having a thickness of, for example, several 100s μm therebetween, and at a rear surface of the fourth wire layer 26d, a resist layer 27e which provides protection from electrical insulation and external environment is formed.

Figure 6A:
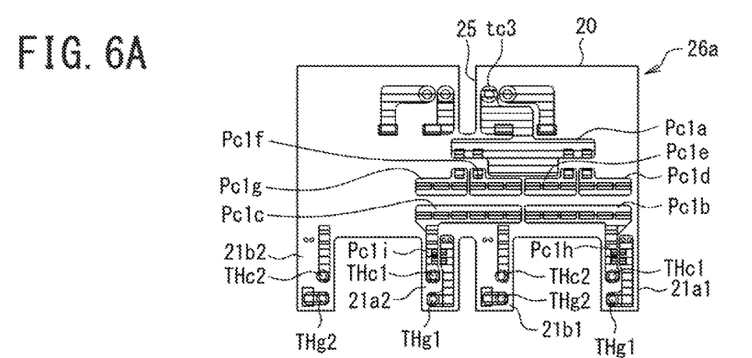
FIG. 6 is a diagram illustrative of a wiring pattern of each wire layer of the signal relay board for power semiconductor modules.
Figure 6B:
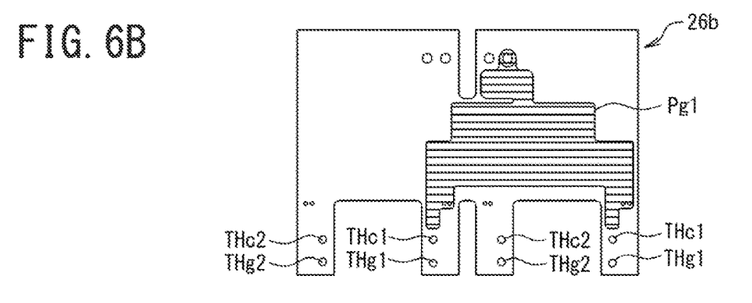

Herein, as illustrated in FIG. 6A, the first wire layer 26a is assigned with a first control wire layer Lc1 connected to the control terminal tc1 in the upper arm UA of the first power semiconductor module PM1 and the second power semiconductor module PM2. As illustrated in FIG. 6B, the second wire layer 26b is similarly assigned with a first ground wire layer Lg1 connected to the ground terminal tg1 in the upper arm UA of the first power semiconductor module PM1 and the second power semiconductor module PM2.

Figure 6C:
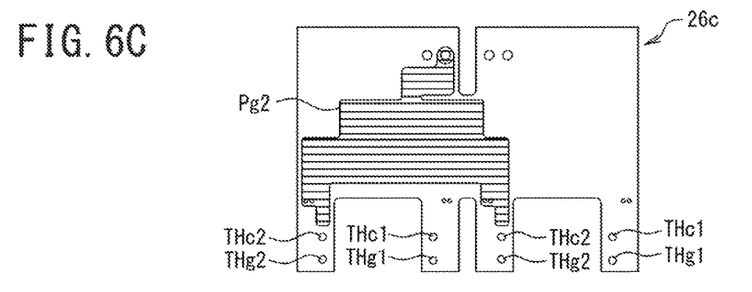
Figure 6D:
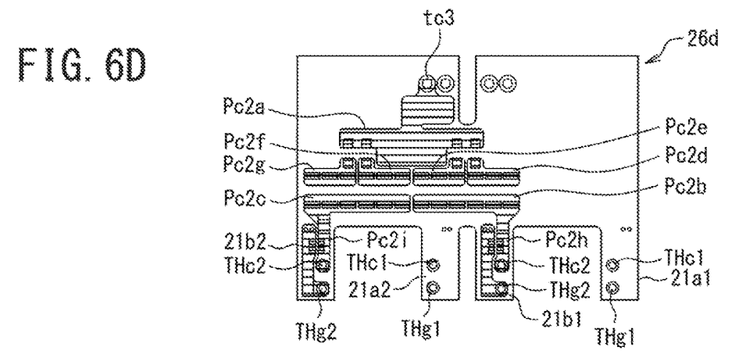

As illustrated in FIG. 6C, the third wire layer 26c is assigned with a second control wire layer Lc2 connected to the control terminal tc2 in the lower arm LA of the first power semiconductor module PM1 and the second power semiconductor module PM2. As illustrated in FIG. 6D, the fourth wire layer 26d is similarly assigned with a second ground wire layer Lg2 connected to the ground terminal tg2 in the lower arm LA of the first power semiconductor module PM1 and the second power semiconductor module PM2.

As illustrated in FIG. 6A, in the first control wire layer Lc1, a wiring pattern mounted with a turn-on current control circuit which controls a current when a semiconductor switching element Q1 constituting the upper arm UA of the first power semiconductor module PM1 and the second power semiconductor module PM2 is turned on is formed in a substantially triangular tournament-tree wiring shape from the plate portion for connection 21a2 to a right end portion of the signal relay board 20.

As illustrated in FIGS. 3 and 6A, in the first control wire layer Lc1, a belt-shaped pattern portion Pc1a connected to a control terminal tc3 of the cable connector 24a and two belt-shaped pattern portions Pc1b, Pc1c formed to maintain a predetermined distance from the belt-shaped pattern portion Pc1a and separated from each other are arranged in parallel. Moreover, two belt-shaped pattern portions Pc1d, Pc1e separated from each other are arranged parallel to and between the belt-shaped pattern portion Pc1a and the belt-shaped pattern portion Pc1b. Similarly, two belt-shaped pattern portions Pc1f, Pc1g separated from each other are arranged parallel to and between the belt-shaped pattern portion Pc1a and the belt-shaped pattern portion Pc1c.

Between the belt-shaped pattern portion Pc1a and the belt-shaped pattern portion Pc1d, a diode D11 in which an anode is connected to the belt-shaped pattern portion Pc1a and a cathode is connected to the belt-shaped pattern portion Pc1d is connected. Between the belt-shaped pattern portion Pc1a and the belt-shaped pattern portion Pc1e, a diode D12 in which a cathode is connected to the belt-shaped pattern portion Pc1a and an anode is connected to the belt-shaped pattern portion Pc1e is connected.

Between the belt-shaped pattern portion Pc1b and the belt-shaped pattern portion Pc1d, a plurality of resistances R11 which serve as a gate resistance for turn-on are connected in parallel, and between the belt-shaped pattern portion Pc1b and the belt-shaped pattern portion Pc1e, a plurality of resistances R12 which serve as a gate resistance for turn-off are connected in parallel.

Between the belt-shaped pattern portion Pc1a and the belt-shaped pattern portion Pc1f, a diode D21 in which an anode is connected to the belt-shaped pattern portion Pc1a and a cathode is connected to the belt-shaped pattern portion Pc1f is connected. Between the belt-shaped pattern portion Pc1a and the belt-shaped pattern portion Pc1g, a diode D22 in which a cathode is connected to the belt-shaped pattern portion Pc1a and an anode is connected to the belt-shaped pattern portion Pc1g is connected.

Between the belt-shaped pattern portion Pc1c and the belt-shaped pattern portion Pc1f, a plurality of resistances R21 which serve as a gate resistance for turn-on are connected in parallel, and between the belt-shaped pattern portion Pc1b and the belt-shaped pattern portion Pc1g, a plurality of resistances R22 which serve as a gate resistance for turn-off are connected in parallel.

Then, the belt-shaped pattern portion Pc1b is connected to the control terminal tc1 of the upper arm UA of the power semiconductor module PM1 by a pattern portion for connection Pc1h, and the belt-shaped pattern portion Pc1c is connected to the control terminal tc1 of the upper arm UA of the power semiconductor module PM2 by a pattern portion for connection Pc1i.

Moreover, as illustrated in FIG. 6B, the first ground wire layer Lg1 of the second wire layer 26b is formed in a triangular tournament-tree wiring shape from the plate portion for connection 21a2 to a right side edge side with a vertex at a position near the cable connector 24a in such a manner as to cover a contour of an outer periphery of a wiring pattern of the first control wire layer Lc1 of the first wire layer 26a.

Further, as illustrated in FIG. 6C as viewed from above, the second ground wire layer Lg2 of the third wire layer 26c is formed in a tournament-tree wiring shape which is line-symmetric with the first ground wire layer Lg1 of the second wire layer 26c with respect to a center line of the signal relay board 20 in a width direction.

Moreover, as illustrated in FIG. 6D as viewed from above, the second control wire layer Lc2 of the fourth wire layer 26d is formed in a tournament-tree wiring shape which is line-symmetric with the first control wire layer Lc1 of the first wire layer 26a as described above with respect to the center line of the signal relay board 20 in the width direction. Thus, wire layers corresponding to the wire layers Lc1a-Lc1i are denoted by Lc2a-Lc2i.

Then, electrical connection of the first control wire layer Lc1 of the first wire layer 26a and the control terminal tc1 of the first power semiconductor module PM1 is performed by inserting the control terminal tc1 into a through hole THc1 provided to the signal relay board 20 and soldering a top end.

Electrical connection of the first ground wire layer Lg1 of the second wire layer 26b and the ground terminal tg1 of the first power semiconductor module PM1 is performed by inserting the ground terminal tg1 of the first power semiconductor module PM1 into a through hole THg1 provided to the signal relay board 20 and soldering a top end.

Electrical connection of the second ground wire layer Lg2 of the third wire layer 26c and the ground terminal tg2 of the second power semiconductor module PM2 is performed by inserting the ground terminal tg2 of the second power semiconductor module PM2 into a through hole THg2 provided to the signal relay board 20 and soldering a top end.

Electrical connection of the second control wire layer Lc2 of the fourth wire layer 26d and the control terminal tc2 of the second power semiconductor module PM2 is performed by inserting the control terminal tc2 into a through hole THc2 provided to the signal relay board 20 and soldering a top end.

Figure 5:
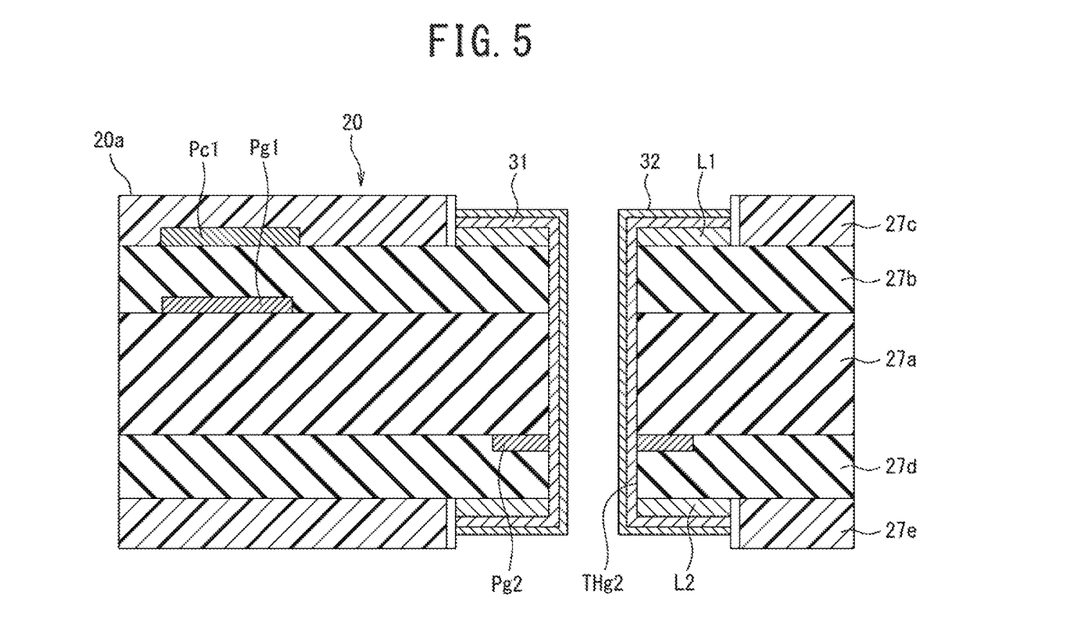
FIG. 5 is a cross-sectional view of through hole position in a case in which electrical connection of the signal relay board for power semiconductor modules to an interior wire layer is performed.

Herein, if examples of the through holes THc1-THg2 are described using the through hole THg2 as a representative example, as illustrated in FIG. 5, on a top surface of the insulation layer 27d facing the second ground wire layer Lg2 of the third wire layer 26c, a land pattern L1 made of a copper foil is formed. Similarly, on a bottom surface of the insulation layer 27b facing the second ground wire layer Lg2 of the third wire layer 26c, a land pattern L2 made of a copper foil is formed. Then, the through hole THg2 penetrating the second ground wire layer Lg2 of the third wire layer 26c, and the land patterns L1, L2 is formed. To the through hole THg2 as formed, a copper chemical plating layer 31 and a copper electroplating layer 32 are sequentially provided from an inner periphery surface thereof in such a manner as to reach an outer surface of the land patterns L1, L2.

Also with respect to electrical connection of the second wire layer 26b and the cable connector 24a and electrical connection of the third wire layer 26c and the fourth wire layer 26d and the cable connector 24b, through holes similar to the through holes THc2-THg2 are formed to electrically connect to respective land patterns formed on the top surface of the insulation layer 27b, and such land patterns are electrically connected to the cable connectors 24a, 24b using respective wiring patterns.

Then, the cable connectors 24a, 24b of the signal relay board 20 and the cable connectors 11a, 11b of the drive unit DU are connected through the twisted cables 23a, 23b, respectively, with the shortest distance.

Next, an operation of the embodiment as described above will be described.

First, to configure a half bridge of a power conversion device using the two power semiconductor modules PM1, PM2, the power semiconductor modules PM1, PM2 are arranged in parallel to be separated from each other with a predetermined distance. In such a state, the P terminal tp, the N terminal tn, and the M terminal tm of the power semiconductor modules PM1, PM2 are electrically and mechanically coupled by a P terminal plate 41p, an N terminal plate 41n, and an M terminal plate 41m, respectively.

Simultaneously with this or one after another, to the power semiconductor modules PM1, PM2, the signal relay board 20 is attached. In such attachment of the signal relay board 20, the control terminals tc1, tc2 and the ground terminals tg1, tg2 of the power semiconductor modules PM1, PM2 are respectively inserted into the through holes THc1, THc2, THg1, THg2 and a tip end thereof is made to project from a top surface of the signal relay board 20.

In such a state, soldering is made between the tip end of each of the control terminals tc1, tc2 and the ground terminals tg1, tg2 and the land patterns of through holes THc1, THc2, THg1, THg2, thereby integrating the power semiconductor modules PM1, PM2 and signal relay board 20.

Subsequently, connection between the cable connectors 24a, 24b of the signal relay board 20 and the cable connectors 11a, 11b of the drive unit DU is made by the twisted cables 23a, 23b, respectively, with the shortest distance, and the half bridge of the power conversion device as illustrated in FIG. 3 can be configured.

Then, as illustrated in FIG. 3, the P terminal plate 41p and the N terminal plate 41n are connected to a positive electrode and a negative electrode of a direct current power supply Vdc, one end of an inductive load L is connected to the M terminal plate 41m, the other end of the inductive load L is connected to a connection point of capacitors Ca, Cb connected in series to the positive electrode and the negative electrode of a direct current power supply Vdc, and further such a connection point is grounded, whereby an inductive load drive device, such as an inductive heating device, can be configured.

Thus, according to the present embodiment, the control terminal tc1 and the ground terminal tg1 of the upper arm UA and the control terminal tc2 and the ground terminal tg2 of the lower arm LA of the plurality of power semiconductor modules PM1, PM2 and the drive unit DU which serves as a control signal generation unit can be easily connected through the signal relay board 20.

In other words, connection between the signal relay board 20 and the drive unit which serves as a control signal generation unit is made by the twisted cables 23a, 23b, whereby the control terminal tc1 and the ground terminal tg1 of the upper arm UA and the control terminal tc2 and the ground terminal tg2 of the lower arm LA of the plurality of power semiconductor modules PM1, PM2 can be easily connected through the signal relay board 20 to the drive unit DU which serves as a control signal generation unit.

Moreover, in the embodiment as described above, four types of wires, i.e. the first control wire layer Lc1 which serves as a path to provide a control signal to the control terminal of the upper arm of each of the plurality of power semiconductor modules to be connected, the first ground wire layer Lg1 which serves as a path to provide a ground potential to the ground terminal of the upper arm of each of the plurality of power semiconductor modules, the second control wire layer Lc2 which serves as a path to provide a control signal to the control terminal of the lower arm of each of the plurality of power semiconductor modules, and the second ground wire layer Lg2 which serves as a path to provide a ground potential to the ground terminal of the lower arm of each of the plurality of power semiconductor modules are layered to be assigned in such a manner that one type corresponds to one wire layer of the four-layer board.

Thus, when wiring in which each control terminal and ground terminal of the upper arm and the lower arm of the plurality of power semiconductor modules PM1, PM2 is connected to the common drive unit is performed using the signal relay board 20, each wire layer is layered, whereby a signal relay can be easily performed with one board without taking wire intersection into consideration.

Above all, with respect to a first wiring pair composed of the first control wire layer Lc1 and the first ground wire layer Lg1 and a second wiring pair composed of the second control wire layer Lc2 and the second ground wire layer Lg2, a control wire and a ground wire constituting each wiring pair are preferably assigned to the wire layers adjacent to each other.

Further, the first control wire layer Lc1, the first ground wire layer Lg1, the second ground wire layer Lg2, and the second control wire layer Lc2 are preferably assigned to the first to fourth layers 26a-26d in this order or in reverse order.

Thereby, securing interlayer insulation in accordance with necessity of each interlayer and securing signal quality can be aimed.

In other words, in the present embodiment, the core member 27a having a thickness of, for example, substantially 1 mm is arranged at a center and at a front surface side and at a rear surface side, a wiring pair for upper arm and a wiring pair for lower arm are arranged to be separated from each other, while further, at one of the front surface and the rear surface of the core member 27a, the first ground wire layer Lg1 of the upper arm is arranged and at the other, the second ground wire layer Lg2 of the lower arm is arranged.

Thus, in the core member 27a, a material having an insulation performance of several 10s kV/mm of layer penetration withstand voltage is often employed, and if the thickness is approximately 1 mm, the insulation performance is 10s kV. In the signal relay board 20 according to the present embodiment, between the second wire layer 26b and the third wire layer 26c, a high voltage between the upper and lower arms of the semiconductor switching element which can be applied to the module in the power conversion device to be applied is applied. Consequently, usually, at least a rated withstand voltage of the semiconductor switching element or more, and further an insulation withstand voltage as required according to a field of the power conversion device to be applied, and a standard and a reference of each model are required.

However, as in the present embodiment, the core member 27a is present between the ground wire layer Lg1 of the upper arm and the second ground wire layer Lg2 of the lower arm, whereby an insulation withstand voltage as required can be sufficiently satisfied.

Moreover, between the first wire layer 26a and the second wire layer 26b and between the third wire layer 26c and the fourth wire layer 26d, a voltage between the control wire and the ground wire is applied, but a voltage between a control signal and a ground potential thereof is remarkably low compared to a usual main circuit voltage and is several 10s V or less at the highest.

The insulation layer 27b and the prepreg to which 27d is assigned that are respectively inserted between the first wire layer 26a and the second wire layer 26b and between the third wire layer 26c and the fourth wire layer 26d are thin compared to the core member and an insulation performance is relatively low, but usually have a sufficient insulation performance against a voltage between the control wire and the ground wire. Moreover, a layer thickness is small, which provides stronger electromagnetic connection when the control wire and the ground wire of the same arm are arranged to face each other with the insulation layer therebetween and is also preferable in terms of signal quality.

Further, in the present embodiment, it is configured that the control wire and the ground wire of the same arm are assigned to one and the other of the wire layers adjacent to each other and wiring is configured such that the patterns face each other in a parallel flat plate shape.

The control wire and the ground wire of the same arm are in a relationship of a forward path and a backward path of a current. Thus, the ground wire is configured to closely face the control wire, which can enhance and stabilize electromagnetic connection of the both (a magnetic field in which a current flowing the control wire is generated and a magnetic field of a current returning through the ground wire as a return path are tightly connected, in other words, a mutual inductance is increased) and restrain entering and emission of noises.

Moreover, as described above, a mutual inductance of the wiring pairs is increases as much as possible to offset a self-inductance and reduce an effective inductance, which also leads to suppression of overshoot and undershoot due to a voltage surge and prevention of ringing. Such effects have been more and more required according to an increase in frequency of an operating frequency and an enhancement in switching speed of the power semiconductor switching element, and further required particularly when a wide bandgap switching element, such as SiC and GaN, which is often used for high frequency and high speed switching is employed.

Note that to avoid interference due to capacitive coupling, inductive coupling, and the like, the wiring pattern of the upper arm and the lower arm preferably has a small overlapped area, but an influence of such interference is considerably reduced when an upper arm wire group and a lower arm wire group are separated to have a board core member, for example, and thus reduction in overlapped area is not severely required.

Further, with respect to each of the first wiring pair composed of the first control wire layer Lc1 and the first ground wire layer Lg1 and the second wiring pair composed of the second control wire layer Lc2 and the second ground wire layer Lg2, the wiring pattern is preferably configured such that a wire length between the drive unit DU and each of the plurality of power semiconductor modules PM1, PM2 is substantially equal. The wiring pattern is thus configured so that a resistance, an inductance, and a capacitance each parasitic on a path of a signal distributed to each module have a similar value, and a timing at which a signal is transmitted to each module, a value of a voltage of a signal which each module receives and a current, and a waveform indicating temporal variation thereof are apt to be balanced so that a timing of switching and a balance of a current to be switched are apt to be regulated.

The wiring pattern as described above can be easily simply and reasonably configured if a so-called tournament-tree wiring form is employed. Particularly, tournament-tree wiring having high symmetricity and high equality of the wire length can be easily configured when a number of the modules to be connected is plural.

Moreover, in the present embodiment, the signal relay board 20 is provided with an electronic component, such as a resistance, a diode, a capacitor, and an inductor, or a pad for mounting such an electronic component, and a wire.

Herein, the resistance is a gate resistance inserted in series between the drive unit DU and the control terminal of the power semiconductor modules PM1, PM2. The gate resistance allows a switching speed of the semiconductor switching element to be adjusted, whereby a switching loss, a voltage surge, waveform vibrations, noises due to switching, and the like are controlled. As in the present embodiment, the gate resistance and the diode are combined to be mounted, which enables selection of a gate resistance value which differs at the time of turn-on and at the time of turn-off, and a switching performance of the semiconductor switching element can be improved. Moreover, the gate resistance is inserted into a wire portion branched into each module so that effects of suppressing a cross current of a signal current between each module and oscillation may be obtained. Similar effects can be also aimed by using the inductor as a gate core and inserting the same into the control wire.

Alternatively, a high resistance of about several kΩ is inserted between the control wire and the ground wire, which enables protection of the control terminal of the semiconductor switching element.

As illustrated in FIG. 3, between the control wire and the ground wire, a capacitor Cgs may be inserted, whereby a problem due to a balance of a parasitic capacitance between each terminal of the semiconductor switching element is corrected and effects of preventing an erroneous operation of the semiconductor switching element can be obtained.

The board may be supplied while the electronic component, such as the resistance, the capacitor, and the diode as described above, is mounted on the board, and may be supplied while a pad capable of optionally mounting, adding, and replacing the same, and a wire are provided and no component is provided. Moreover, a connector for connecting the board, the modules, the control wire, the ground wire, and the like, a component, such as a test terminal for voltage detection, a pad for mounting the same, and a wire may be provided.

The components as described above and the like may be suitably arranged on both surfaces of a front side and a rear side of the board. At the front side surface of the board, a component belonging to a wire group provided to the wire layer near the front side and the like are preferably provided, and at the rear side surface of the board, a component belonging to a wire group provided to the wire layer near the rear side and the like are preferably provided. In other words, the front and the back of the board are preferably used in a selective manner in relation to the upper arm and the lower arm. The gate resistance is often inserted in the control wire, and the control wire is assigned to the first and fourth wire layers and the gate resistance belonging to the first and fourth wire layers is each provided to a board outer surface at an outer side of the first and fourth wire layers so that at a series connection portion of the control wire and the gate resistance, crossing or intersecting another wire layer is unrequired and an oppositional relationship between a control signal current flowing through the component and a return current of the ground wire layer is also maintained.

Moreover, as a matter of course, both surfaces of the board are configured to be a component mounting surface, which can provide a merit that an area efficiency can be improved, a layout using the component mounting surfaces exclusive for each arm is enabled, and further the wiring pattern can be configured with a short wire length as a whole.

As described above, the wiring pattern for distributing a signal between the modules is configured to have an equal wire length, particularly to be tournament-tree wiring so that the wiring pattern, mounted components, and the like are arranged to be formed with high symmetricity. Moreover, the upper arm wire group, mounted components, and the like and the lower arm wire group, mounted components, and the like can be also allocated to the front side of the board and the wire layer near the front side and the rear side of the board and the wire layer near the rear side and designed basically with a similar arrangement. Consequently, the entirety of the signal relay board has an appearance having high symmetricity when the wiring pattern, mounted components, and the like are transparently viewed from one side of the board. Complete and strict symmetricity is not always required, but a symmetric arrangement can provide a merit that an equal length of the wires and a balance of electrical properties can be easily secured, check and management of mounted components and the like can be easily performed, and the like.

Note that in the embodiments as described above, as the signal relay board 20, basically, a board generally known as a four-layer board in the first of printed wiring boards is used, but the present invention also includes a case in which a signal relay board substantially similar to that of the embodiments as described above is realized using a substrate having four or more layers (a layer more than necessary is not used or used for a ground and shield potential, or overlapped with a layer functioning in the present invention, and the like), a case in which a signal relay board substantially similar to that of the present invention by configuring, in a two-layer board, component mounting surfaces of the front and rear of the board to be also mounted with wiring, and the like.

Moreover, in the embodiments as described above, a case in which the signal relay board 20 is a rigid printed wiring board has been described, which is not limitative, and for example, a flexible board having a film of polyimide or a sheet-shaped board as a base can be employed.

Moreover, in the embodiments as described above, a case in which the second wire layer 26*b* of the multiphase board portion is assigned to the first ground wire layer Lg1 has been described, but the first ground wire layer Lg1 may be grounded. In such a case, the second wire layer 26*b* can produce shield effects.

Further, in the embodiments as described above, a case in which the gate resistances R11, R12 for adjusting a switching speed of the semiconductor switching element Q to be driven and the diodes D11-D22 for switching such a value by turn-on/turn-off are provided to the signal relay board 20 has been described. The present invention is not limited the above configuration, but the signal relay board 20 may be provided with a capacitor, a resistance, and the like which are inserted between the control terminal and the ground terminal of the semiconductor switching element for various protection and prevention of an erroneous operation.

Moreover, in place of a case in which the signal relay board 20 is provided with a gate resistance, a diode, and a capacitor for various protection and prevention of an erroneous operation, it may be also configured that the drive unit DU is provided with a gate resistance, a diode, and a capacitor. Further, it may be also configured that a gate resistance is provided to the signal relay board 20 and a diode is provided to the drive unit DU.

Figure 7:
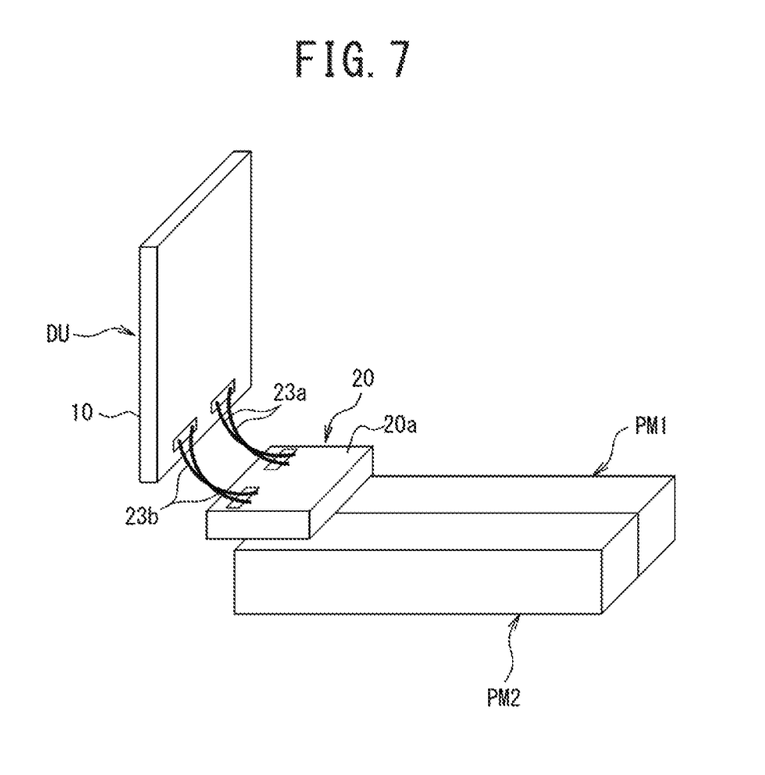
FIG. 7 is a perspective view in a case in which a drive unit is provided to be intersected with the signal relay board for power semiconductor modules.

In addition, in the embodiments as described above, a case in which the signal relay board 20 and the drive unit DU are arranged on the same plane has been described, but can be disposed on planes parallel to each other and, as illustrated in FIG. 7, the drive unit DU can be disposed on a plane orthogonal to the signal relay board 20.

Further, in the embodiments as described above, a case in which the drive unit DU is formed on a board different from the signal relay board 20 has been described, which is not limitative, and the drive unit DU may be formed on the signal relay board 20. In such a case, the cable connectors 11a, 11b, 24a, 24b and the twisted cables 23a, 23b can be omitted.

REFERENCE SIGNS LIST

PM1, PM2 power semiconductor module
tp P terminal
tn N terminal
tm M terminal
tc1, tc2 control terminal
tg1, tg2 ground terminal
DU drive unit
10 circuit board
11a, 11b cable connector
20 signal relay board for power semiconductor modules
21a1, 21a2, 21b1, 21b2 plate portion for connection
22, 25 slit for insulation
23a, 23b twisted cable
24a, 24b cable connector
26a first wire layer
26b second wire layer
26c third wire layer
26d fourth wire layer
27a core member
27b insulation layer
27c resist layer
27d insulation layer
27e resist layer
Lc1 first control wire layer
Lg1 first ground wire layer
Lc2 second control wire layer
Lg2 second ground wire layer
THc1, THc2, THg1, THg2 through hole
L1, L2 land pattern

The invention claimed is:

1. A signal relay board for power semiconductor modules configured to provide connection between a plurality of power semiconductor modules which houses a first semiconductor device and a second semiconductor device connected in series and a drive unit which drives the first semiconductor device and the second semiconductor device, the signal relay board for power semiconductor modules comprising:
a multiphase wire portion in which a first wire layer, a second wire layer, a third wire layer, and a fourth wire layer are stacked in this order, wherein the first wire layer, the second wire layer, the third wire layer, and the fourth wire layer are respectively assigned with a first control wire layer which serves as a path to provide a control signal to the first semiconductor device of the plurality of power semiconductor modules, a first ground wire layer which serves as a path to provide a ground potential to a low potential side terminal of the first semiconductor device of the plurality of power semiconductor modules, a second control wire layer which serves as a path to provide a control signal to the second semiconductor device of the plurality of power semiconductor modules, and a second ground wire layer which serves as a path to provide a ground potential to the second semiconductor device of the plurality of power semiconductor modules.

2. The signal relay board for power semiconductor modules according to claim 1, further comprising a first wiring pair composed of the first control wire layer and the first ground wire layer arranged adjacent to each other, and a second wiring pair composed of the second control wire layer and the second ground wire layer arranged adjacent to each other.

3. The signal relay board for power semiconductor modules according to claim 1, wherein the first control wire layer, the first ground wire layer, the second control wire layer, and the second ground wire layer are stacked in this order.

4. The signal relay board for power semiconductor modules according to claim 2, wherein with respect to each of the first wiring pair and the second wiring pair, a control wiring pattern and a ground wiring pattern are formed to face each other.

5. The signal relay board for power semiconductor modules according to claim 1, wherein an insulation property between the second wire layer and the third wire layer is set to be greater than an insulation property between the first wire layer and the second wire layer and an insulation property between the third wire layer and the fourth wire layer.

6. The signal relay board for power semiconductor modules according to claim 1, wherein a board core member is arranged between the second wire layer and the third wire layer.

7. The signal relay board for power semiconductor modules according to claim 2, wherein with respect to each of the first wiring pair and the second wiring pair, the wiring pattern is configured such that a wire length between the drive unit and each of the plurality of power semiconductor modules is equal.

8. The signal relay board for power semiconductor modules according to claim 1, wherein the multiphase wire portion is configured to mount a passive electronic component on at least one of a front surface and a rear surface.

9. The signal relay board for power semiconductor modules according to of claim 1, wherein a wiring pattern formed on a front surface or a wire layer near the front surface and a second wiring pattern formed on a rear surface or a wire layer near the rear surface are arranged symmetrically as viewed from the front surface, a passive electronic component mounted on the front surface and a passive electronic component mounted on the rear surface are arranged symmetrically as viewed from the front surface, and a pattern for mounting the passive electronic component mounted on the front surface, and a pattern for mounting the passive electronic component on the rear surface are arranged symmetrically as viewed from the front surface.

10. The signal relay board for power semiconductor modules according to claim 1, wherein the semiconductor devices are composed of a wide bandgap semiconductor element.

11. The signal relay board for power semiconductor modules according to claim 2, wherein an insulation property between the second wire layer and the third wire layer is set to be greater than an insulation property between the first wire layer and the second wire layer, and is set to be greater than an insulation property between the third wire layer and the fourth wire layer.

12. The signal relay board for power semiconductor modules according to claim 3, wherein an insulation property between the second wire layer and the third wire layer is set to be greater than an insulation property between the first wire layer and the second wire layer, and is set to be greater than an insulation property between the third wire layer and the fourth wire layer.

13. The signal relay board for power semiconductor modules according to claim 4, wherein an insulation property between the second wire layer and the third wire layer is set to be greater than an insulation property between the first wire layer and the second wire layer, and is set to be greater than an insulation property between the third wire layer and the fourth wire layer.

14. The signal relay board for power semiconductor modules according to claim 2, wherein a board core member is arranged between the second wire layer and the third wire layer.

15. The signal relay board for power semiconductor modules according to claim 3, wherein a board core member is arranged between the second wire layer and the third wire layer.

16. The signal relay board for power semiconductor modules according to claim 4, wherein a board core member is arranged between the second wire layer and the third wire layer.

17. The signal relay board for power semiconductor modules according to claim 5, wherein a board core member is arranged between the second wire layer and the third wire layer.

18. The signal relay board for power semiconductor modules according to claim 2, wherein the multiphase wire portion is configured to mount a passive electronic component on at least one of a front surface and a rear surface.

19. The signal relay board for power semiconductor modules according to claim 3, wherein the multiphase wire portion is configured to mount a passive electronic component on at least one of a front surface and a rear surface.

* * * * *

UNITED STATES PATENT AND TRADEMARK OFFICE
CERTIFICATE OF CORRECTION

PATENT NO. : 10,276,386 B2
APPLICATION NO. : 15/638009
DATED : April 30, 2019
INVENTOR(S) : Ryohei Makino et al.

Page 1 of 1

It is certified that error appears in the above-identified patent and that said Letters Patent is hereby corrected as shown below:

In the Claims

In Column 16, Line 42:
Claim 9, after "to" delete "of"

Signed and Sealed this
Second Day of July, 2019

Andrei Iancu
*Director of the United States Patent and Trademark Office*